United States Patent
Vilale et al.

(10) Patent No.: US 12,332,131 B2
(45) Date of Patent: Jun. 17, 2025

(54) INDUSTRIAL INTERNET OF THINGS (IIOT) IN-SITU STRESS REAL-TIME MONITORING SYSTEM

(71) Applicant: Flex Ltd., Singapore (SG)

(72) Inventors: Rodimir N. Vilale, Tracy, CA (US); Raymundo Alatorre Mercado, Tracy, CA (US); William L. Uy, San Jose, CA (US); Murad M. Kurwa, San Jose, CA (US)

(73) Assignee: Flex Ltd., Singapore (SG)

( * ) Notice: Subject to any disclaimer, the term of this patent is extended or adjusted under 35 U.S.C. 154(b) by 498 days.

(21) Appl. No.: 17/885,101

(22) Filed: Aug. 10, 2022

(65) Prior Publication Data

US 2023/0049986 A1 Feb. 16, 2023

Related U.S. Application Data

(60) Provisional application No. 63/231,345, filed on Aug. 10, 2021.

(51) Int. Cl.
*G01L 1/26* (2006.01)

(52) U.S. Cl.
CPC ..................... *G01L 1/26* (2013.01)

(58) Field of Classification Search
CPC .... G01L 1/26; G01R 31/2808; G01R 31/2817
USPC .......................................................... 177/211
See application file for complete search history.

(56) References Cited

U.S. PATENT DOCUMENTS

| | | | |
|---|---|---|---|
| 6,326,797 B2* | 12/2001 | Caggiano | G01R 31/2808 324/763.01 |
| 9,638,742 B2* | 5/2017 | Suto | G01R 31/2815 |
| 10,168,383 B2* | 1/2019 | Hoffmeyer | G01R 31/2817 |
| 11,599,095 B1* | 3/2023 | Shao | G16Y 10/25 |
| 2010/0076705 A1* | 3/2010 | Liu | G01R 31/382 702/63 |

* cited by examiner

*Primary Examiner* — Jacques M Saint Surin
(74) *Attorney, Agent, or Firm* — Sheridan Ross P.C.

(57) ABSTRACT

Embodiments of the present disclosure provide sensors inside an In-Circuit Tester (ICT) that measure stress on a Printed Circuit Board (PCB) every time the ICT runs through a manufacturing process. This ICT can comprise an Internet of Things (IoT) device which can measure, monitor, record, and show stress data that is being exerted by ICTs on the mounted PCB in real-time during tests thereby providing technicians an ability to oversee failures based on historical data that the IoT device provides.

20 Claims, 6 Drawing Sheets

INDUSTRIAL INTERNET OF THINGS (IIOT) IN-SITU STRESS REAL-TIME MONITORING SYSTEM

CROSS REFERENCE TO RELATED APPLICATION

The present application claims the benefits of and priority, under 35 U.S.C. § 119(e), to U.S. Provisional Application No. 63/231,345 filed Aug. 10, 2021 by Ridimir, et. al. and entitled "IIoT In-Situ Stress Real-Time Monitoring System" of which the entire disclosure is incorporated herein by reference for all purposes.

FIELD OF THE DISCLOSURE

Embodiments of the present disclosure relate generally to methods and systems for testing of electronic components and more particularly to an in-circuit tester for testing stress on a electronic component during the manufacturing process.

BACKGROUND

Printed Circuit Board (PCB) strain gauge tests are currently only being done in the early stages of the manufacturing setup requested by customers and only when a quality issue arises that is In-Circuit Tester related. Strain/stress related defects on products can pass all inspection, get to the customer's hands and fail. When a fault/failure is caught, the production line could have already produced a significant amount of product with the same failure as the one caught either on the shop floor or at the customers causing a massive amount of repair or even scrap parts. Hence, there is a need for improved methods and systems for testing stress on a electronic component during the manufacturing process.

Figure 1:
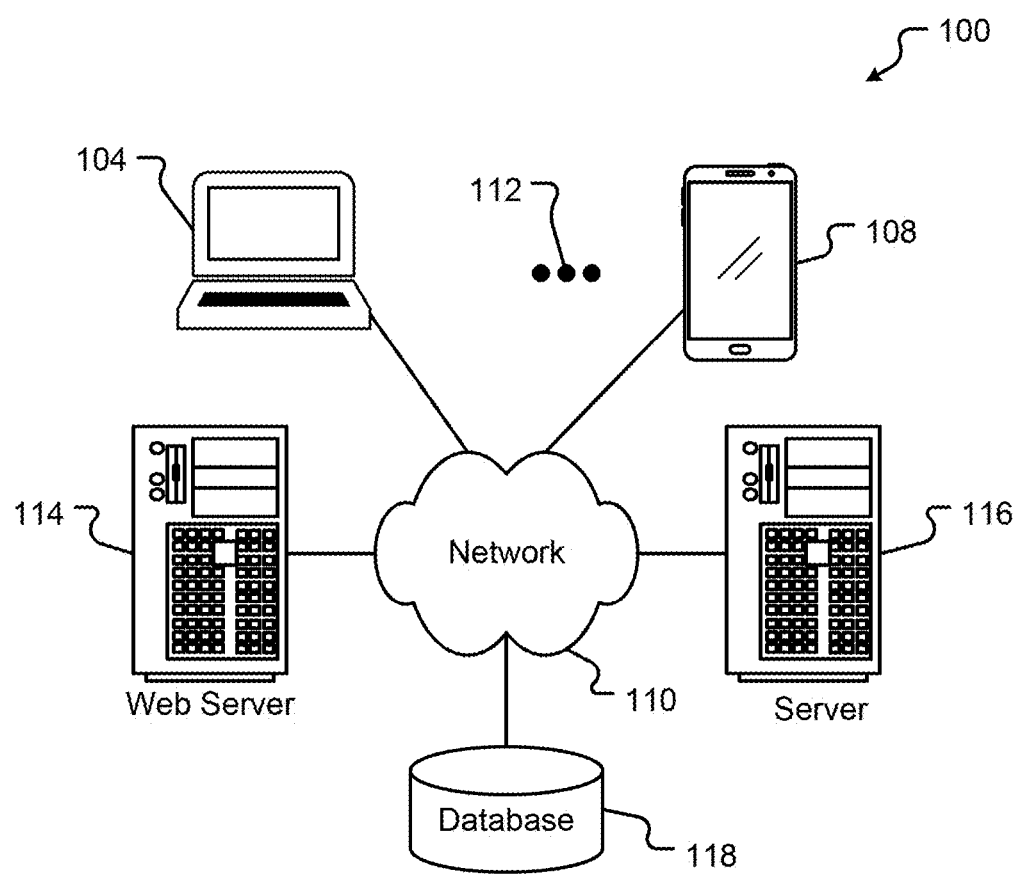
FIG. 1 is a block diagram illustrating elements of an exemplary computing environment in which embodiments of the present disclosure may be implemented.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

In the following description, for the purposes of explanation, numerous specific details are set forth in order to provide a thorough understanding of various embodiments disclosed herein. It will be apparent, however, to one skilled in the art that various embodiments of the present disclosure may be practiced without some of these specific details. The ensuing description provides exemplary embodiments only and is not intended to limit the scope or applicability of the disclosure. Furthermore, to avoid unnecessarily obscuring the present disclosure, the preceding description omits a number of known structures and devices. This omission is not to be construed as a limitation of the scopes of the claims. Rather, the ensuing description of the exemplary embodiments will provide those skilled in the art with an enabling description for implementing an exemplary embodiment. It should however be appreciated that the present disclosure may be practiced in a variety of ways beyond the specific detail set forth herein.

While the exemplary aspects, embodiments, and/or configurations illustrated herein show the various components of the system collocated, certain components of the system can be located remotely, at distant portions of a distributed network, such as a Local-Area Network (LAN) and/or Wide-Area Network (WAN) such as the Internet, or within a dedicated system. Thus, it should be appreciated, that the components of the system can be combined in to one or more devices or collocated on a particular node of a distributed network, such as an analog and/or digital telecommunications network, a packet-switch network, or a circuit-switched network. It will be appreciated from the following description, and for reasons of computational efficiency, that the components of the system can be arranged at any location within a distributed network of components without affecting the operation of the system.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed.

Human input that consents to the performance of the process or operation is not deemed to be "material."

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, Non-Volatile Random-Access Memory (NVRAM), or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a Compact Disk Read-Only Memory (CD-ROM), any other optical medium, punch cards, paper tape, any other physical medium with patterns of holes, a Random-Access Memory (RAM), a Programmable Read-Only Memory (PROM), and Erasable Programmable Read-Only Memory (EPROM), a Flash-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

A "computer readable signal" medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, Radio Frequency (RF), etc., or any suitable combination of the foregoing.

The terms "determine," "calculate," and "compute," and variations thereof, as used herein, are used interchangeably and include any type of methodology, process, mathematical operation or technique.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the disclosure, brief description of the drawings, detailed description, abstract, and claims themselves.

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Any combination of one or more computer readable medium(s) may be utilized. The computer readable medium may be a computer readable signal medium or a computer readable storage medium.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as Programmable Logic Device (PLD), Programmable Logic Array (PLA), Field Programmable Gate Array (FPGA), Programmable Array Logic (PAL), special purpose computer, any comparable means, or the like. In general, any device(s) or means capable of implementing the methodology illustrated herein can be used to implement the various aspects of this disclosure. Exemplary hardware that can be used for the disclosed embodiments, configurations, and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

Examples of the processors as described herein may include, but are not limited to, at least one of Qualcomm® Snapdragon® 800 and 801, Qualcomm® Snapdragon® 610 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX-4300, FX-6300, and FX-8350 32 nm Vishera, AMD® Kaveri processors, Texas Instruments® Jacinto C6000™ automotive infotainment processors, Texas Instruments® OMAP™ automotive-grade mobile processors, ARM® Cortex™-M processors, ARM® Cortex-A and ARM926EJ-S™ processors, other industry-equivalent processors, and may perform computational functions using any known or future-developed standard, instruction set, libraries, and/or architecture.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or Very Large-Scale Integration (VLSI) design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or Common Gateway Interface (CGI) script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

Various additional details of embodiments of the present disclosure will be described below with reference to the figures. While the flowcharts will be discussed and illustrated in relation to a particular sequence of events, it should be appreciated that changes, additions, and omissions to this sequence can occur without materially affecting the operation of the disclosed embodiments, configuration, and aspects.

FIG. 1 is a block diagram illustrating elements of an exemplary computing environment in which embodiments of the present disclosure may be implemented. More specifically, this example illustrates a computing environment 100 that may function as the servers, user computers, or other systems provided and described herein. The environment 100 includes one or more user computers, or computing devices, such as a computing device 104, a communication device 108, and/or more 112. The computing devices 104, 108, 112 may include general purpose personal computers (including, merely by way of example, personal computers, and/or laptop computers running various versions of Microsoft Corp.'s Windows® and/or Apple Corp.'s Macintosh® operating systems) and/or workstation computers running any of a variety of commercially-available UNIX® or UNIX-like operating systems. These computing devices 104, 108, 112 may also have any of a variety of applications, including for example, database client and/or server applications, and web browser applications. Alternatively, the computing devices 104, 108, 112 may be any other electronic device, such as a thin-client computer, Internet-enabled mobile telephone, and/or personal digital assistant, capable of communicating via a network 110 and/or displaying and navigating web pages or other types of electronic documents. Although the exemplary computer environment 100 is shown with two computing devices, any number of user computers or computing devices may be supported.

Environment 100 further includes a network 110. The network 110 may can be any type of network familiar to those skilled in the art that can support data communications using any of a variety of commercially-available protocols, including without limitation Session Initiation Protocol (SIP), Transmission Control Protocol/Internet Protocol (TCP/IP), Systems Network Architecture (SNA), Internetwork Packet Exchange (IPX), AppleTalk, and the like. Merely by way of example, the network 110 maybe a Local Area Network (LAN), such as an Ethernet network, a Token-Ring network and/or the like; a wide-area network; a virtual network, including without limitation a Virtual Private Network (VPN); the Internet; an intranet; an extranet; a Public Switched Telephone Network (PSTN); an infra-red network; a wireless network (e.g., a network operating under any of the IEEE 802.9 suite of protocols, the Bluetooth® protocol known in the art, and/or any other wireless protocol); and/or any combination of these and/or other networks.

The system may also include one or more servers 114, 116. In this example, server 114 is shown as a web server and server 116 is shown as an application server. The web server 114, which may be used to process requests for web pages or other electronic documents from computing devices 104, 108, 112. The web server 114 can be running an operating system including any of those discussed above, as well as any commercially-available server operating systems. The web server 114 can also run a variety of server applications, including SIP servers, HyperText Transfer Protocol (secure) (HTTP(s)) servers, FTP servers, CGI servers, database servers, Java servers, and the like. In some instances, the web server 114 may publish operations available operations as one or more web services.

The environment 100 may also include one or more file and or/application servers 116, which can, in addition to an operating system, include one or more applications accessible by a client running on one or more of the computing devices 104, 108, 112. The server(s) 116 and/or 114 may be one or more general purpose computers capable of executing programs or scripts in response to the computing devices 104, 108, 112. As one example, the server 116, 114 may execute one or more web applications. The web application may be implemented as one or more scripts or programs written in any programming language, such as Java™, C, C#®, or C++, and/or any scripting language, such as Perl, Python, or Tool Command Language (TCL), as well as combinations of any programming/scripting languages. The application server(s) 116 may also include database servers, including without limitation those commercially available from Oracle®, Microsoft®, Sybase®, IBM® and the like, which can process requests from database clients running on a computing device 104, 108, 112.

The web pages created by the server 114 and/or 116 may be forwarded to a computing device 104, 108, 112 via a web (file) server 114, 116. Similarly, the web server 114 may be able to receive web page requests, web services invocations, and/or input data from a computing device 104, 108, 112 (e.g., a user computer, etc.) and can forward the web page requests and/or input data to the web (application) server 116. In further embodiments, the server 116 may function as a file server. Although for ease of description, FIG. 1 illustrates a separate web server 114 and file/application server 116, those skilled in the art will recognize that the functions described with respect to servers 114, 116 may be performed by a single server and/or a plurality of specialized servers, depending on implementation-specific needs and parameters. The computer systems 104, 108, 112, web (file) server 114 and/or web (application) server 116 may function as the system, devices, or components described herein.

The environment 100 may also include a database 118. The database 118 may reside in a variety of locations. By way of example, database 118 may reside on a storage medium local to (and/or resident in) one or more of the computers 104, 108, 112, 114, 116. Alternatively, it may be remote from any or all of the computers 104, 108, 112, 114, 116, and in communication (e.g., via the network 110) with one or more of these. The database 118 may reside in a Storage-Area Network (SAN) familiar to those skilled in the art. Similarly, any necessary files for performing the functions attributed to the computers 104, 108, 112, 114, 116 may be stored locally on the respective computer and/or remotely, as appropriate. The database 118 may be a relational database, such as Oracle 20i®, that is adapted to store, update, and retrieve data in response to Structured Query Language (SQL) formatted commands.

Figure 2:
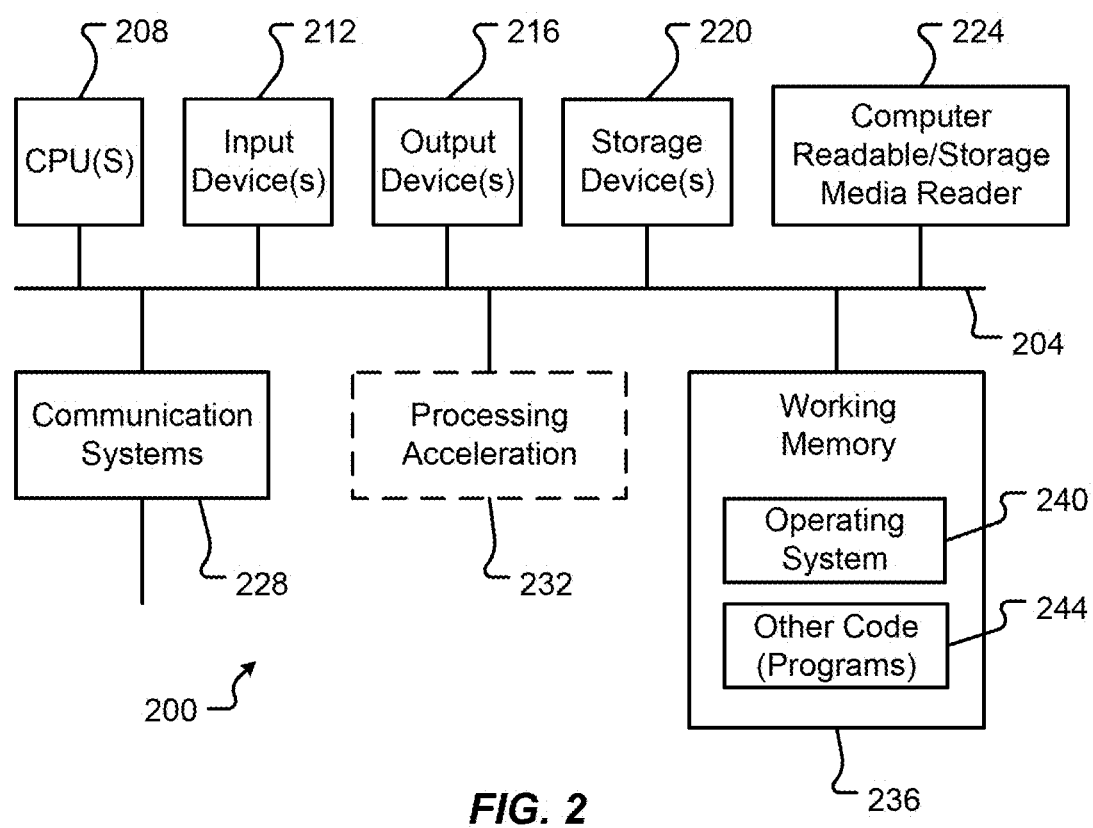
FIG. 2 is a block diagram illustrating elements of an exemplary computing device in which embodiments of the present disclosure may be implemented.

FIG. 2 is a block diagram illustrating elements of an exemplary computing device in which embodiments of the present disclosure may be implemented. More specifically, this example illustrates one embodiment of a computer system 200 upon which the servers, user computers, computing devices, or other systems or components described above may be deployed or executed. The computer system 200 is shown comprising hardware elements that may be electrically coupled via a bus 204. The hardware elements may include one or more Central Processing Units (CPUs) 208; one or more input devices 212 (e.g., a mouse, a keyboard, etc.); and one or more output devices 216 (e.g., a display device, a printer, etc.). The computer system 200 may also include one or more storage devices 220. By way of example, storage device(s) 220 may be disk drives, optical storage devices, solid-state storage devices such as a Random-Access Memory (RAM) and/or a Read-Only Memory (ROM), which can be programmable, flash-updateable and/or the like.

The computer system 200 may additionally include a computer-readable storage media reader 224; a communications system 228 (e.g., a modem, a network card (wireless or wired), an infra-red communication device, etc.); and working memory 236, which may include RAM and ROM devices as described above. The computer system 200 may also include a processing acceleration unit 232, which can include a Digital Signal Processor (DSP), a special-purpose processor, and/or the like.

The computer-readable storage media reader 224 can further be connected to a computer-readable storage medium, together (and, optionally, in combination with storage device(s) 220) comprehensively representing remote, local, fixed, and/or removable storage devices plus storage media for temporarily and/or more permanently containing computer-readable information. The communications system 228 may permit data to be exchanged with a network and/or any other computer described above with respect to the computer environments described herein. Moreover, as disclosed herein, the term "storage medium" may represent one or more devices for storing data, including ROM, RAM, magnetic RAM, core memory, magnetic disk storage mediums, optical storage mediums, flash memory devices and/or other machine-readable mediums for storing information.

The computer system 200 may also comprise software elements, shown as being currently located within a working memory 236, including an operating system 240 and/or other code 244. It should be appreciated that alternate embodiments of a computer system 200 may have numerous variations from that described above. For example, customized hardware might also be used and/or particular elements might be implemented in hardware, software (including portable software, such as applets), or both. Further, connection to other computing devices such as network input/output devices may be employed.

Examples of the processors 208 as described herein may include, but are not limited to, at least one of Qualcomm® Snapdragon® 800 and 801, Qualcomm® Snapdragon® 620 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX-4300, FX-6300, and FX-8350 32 nm Vishera, AMD® Kaveri processors, Texas Instruments® Jacinto C6000™ automotive infotainment processors, Texas Instruments® OMAP™ automotive-grade mobile processors, ARM® Cortex™-M processors, ARM® Cortex-A and ARM926EJ-S™ processors, other industry-equivalent processors, and may perform computational functions using any known or future-developed standard, instruction set, libraries, and/or architecture.

Embodiments of the present disclosure provide sensors inside an In-Circuit Tester (ICT) that measure stress on a Printed Circuit Board (PCB) every time the ICT runs through a manufacturing process. This ICT can comprise an Internet of Things (IoT) device which can measure, monitor, record, and show stress data that is being exerted by ICTs on the mounted PCB in real-time during tests thereby providing technicians an ability to oversee failures based on historical data that the IoT device provides. Such embodiments provide for early defect detection. When an anomaly from the real-time data that is being shown is presented, action can be taken on time to prevent the production process from making more defects. Embodiments also provide a non-destructive test method. Strain gauges can be costly because the sensors are bonded to the PCB that is being tested. After the strain gauge test, the PCB and the sensors bonded with it are scrapped. With the embodiments of the present IoT in-situ stress gauge, the sensors can be placed inside an ICT and stay there for the lifetime of the ICT. Sensors can also be easily replaced if a sensor malfunctions. Additionally, embodiments can provide for predictive maintenance on ICT equipment. With real-time data being produced by the IOT in-situ stress gauge system, historical data can be collected from the moment the system is installed up to the present to see how much the pressure being produced by the ICT have changed and act based on that data.

Figure 3:
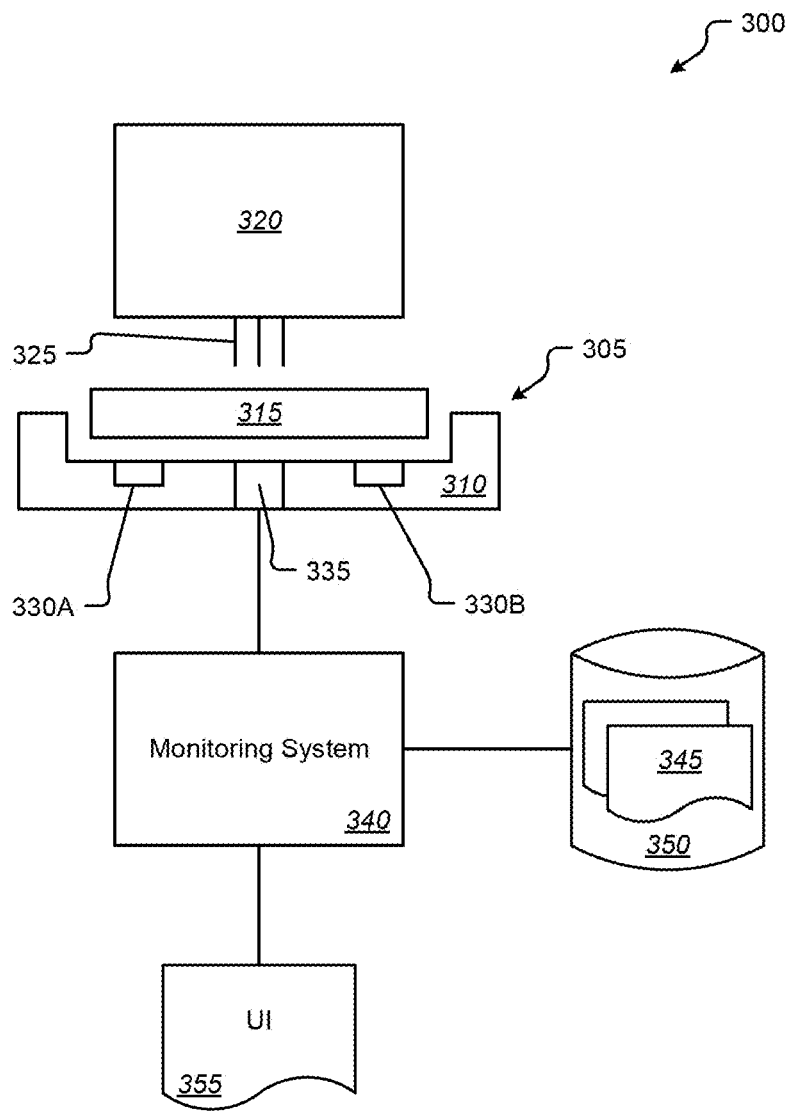
FIG. 3 is a block diagram illustrating an exemplary manufacturing and testing environment in which embodiments of the present disclosure may be implemented.

FIG. 3 is a block diagram illustrating an exemplary manufacturing and testing environment in which embodiments of the present disclosure may be implemented. As illustrated in this example, manufacturing and testing environment can include an ICT device 305 comprising a clamp shell 310. As known in the art, a PCB 315 can be retained in the clamp shell 310 while being manufactured and/or tested. For example, a test device 320 comprising a number of pogo pins 325 can be brought into contact with the PCB 315. The pogo pins 325 can make electrical contact with various points on the PCB 315 so that tests can be performed. However, this exerts a force onto the PCB 315.

According to one embodiment, the ICT device 305 can further comprise one or more force sensitive sensors 330A and 330B disposed at one or more locations in the clamp shell 310 and an IoT device coupled with the one or more sensors 330A and 330B. For example, the one or more sensors 330A and 330B can be installed underneath a staging plate (not shown here) of the PCB at a location where common faults or damage occurs. The sensors can be placed inside the ICT indefinitely and can be easily replaced with new ones in case of deterioration and or failure.

Generally speaking, the IoT device 335 can read an input signal from each of the one or more sensors 330A and 330B. The input signal from each sensor 330A and 330B can indicate an amount of force on the PCB 315 mounted in the clamp shell 315 and can be read from each of the sensors 330A and 330B in real-time while a test is being conducted on the PCB 315. The IOT device 335 can log a set of results indicating the amount of force on the PCB 315 during the test based on the input signal from each of the one or more sensors 330A and 330B and wirelessly to transmit the logged set of results.

The environment 300 can also include a monitoring system 340. The monitoring system 340 can comprise any server or other computing device as described above. Generally speaking, the monitoring system can receive the logged data from the IoT device 335 and present a visual indication of the force applied to the PCB 315 during the test based on the received data logged by the IoT device 335. For example, the monitoring system 340 may present a graphical and/or textual user interface 355 etc.

The monitoring system 340 can also store the received data in a set of historical records 345, i.e., sets of results from previous tests sent to the monitoring system 340 by the same and/or other IoT devices maintained in a database 350 or other repository. From or based on this set of historical records 345, a determination can be made as to whether the received data logged by the IoT device 335 indicates a problem with the PCB 315, e.g., whether a force detected exceeds a threshold or a force detected is greater or less than previous results by a predetermined maximum variance, etc. In response to determining the received data logged by the IoT device indicates a problem with the PCB, the monitoring system 340 may initiate an action directed to the problem. For example, the monitoring system 340 may present a warning, alarm, or other indication in a user interface 355, issue a message or otherwise signal production and/or other testing system to halt production, etc.

Figure 4:
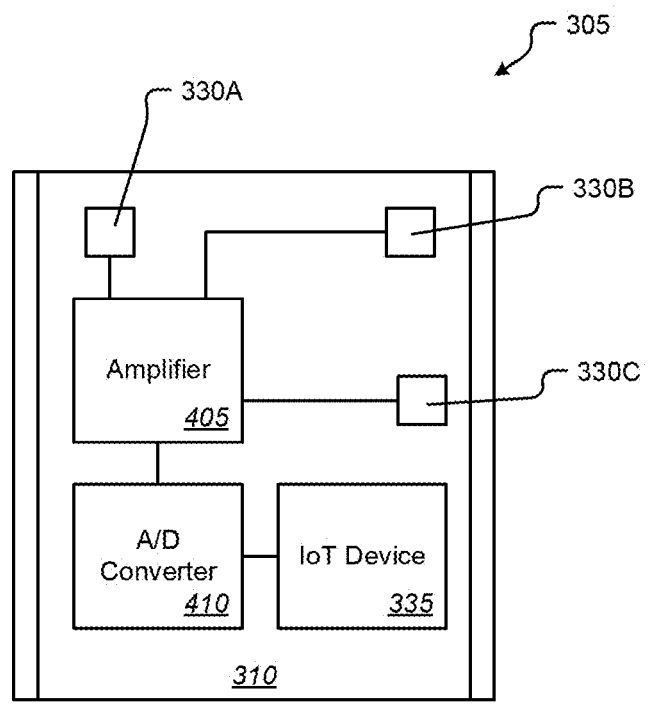
FIG. 4 is a block diagram illustrating components of an exemplary in-circuit tester according to one embodiment of the present disclosure.

FIG. 4 is a block diagram illustrating components of an exemplary in-circuit tester according to one embodiment of the present disclosure. As illustrated in this example, and as introduced above, the ICT 305 can comprise a clamp shell 310, one or more sensors 330A-330C disposed at one or more locations in the clamp shell 310, and an IoT device 335 coupled with the one or more sensors. The IoT device 335, as known in the art, can comprise a processor (not shown here), e.g., a microprocessor or microcontroller, and a memory (not shown here) coupled with and readable by the processor. For example, the IoT device 335 can comprise an Arduino device. In another example, the IoT device 335 can comprise a Raspberry-Pi device.

The ICT device 335 can further comprise an amplifier 405 coupled with each of the one or more sensors 330A-330C and an analog-to-digital converter 410 coupled with the amplifier 405 and the IoT device 335. The IoT device 335 can read the input signal from each of the one or more sensors 330A-330C through the amplifier 405 and the analog-to-digital converter 410, log the set of results indicating the amount of force on the PCB 315 during the test based on the input signal from each of the one or more sensors 330A-330C, and wirelessly transmit the logged set of results to the monitoring system 340.

Figure 5:
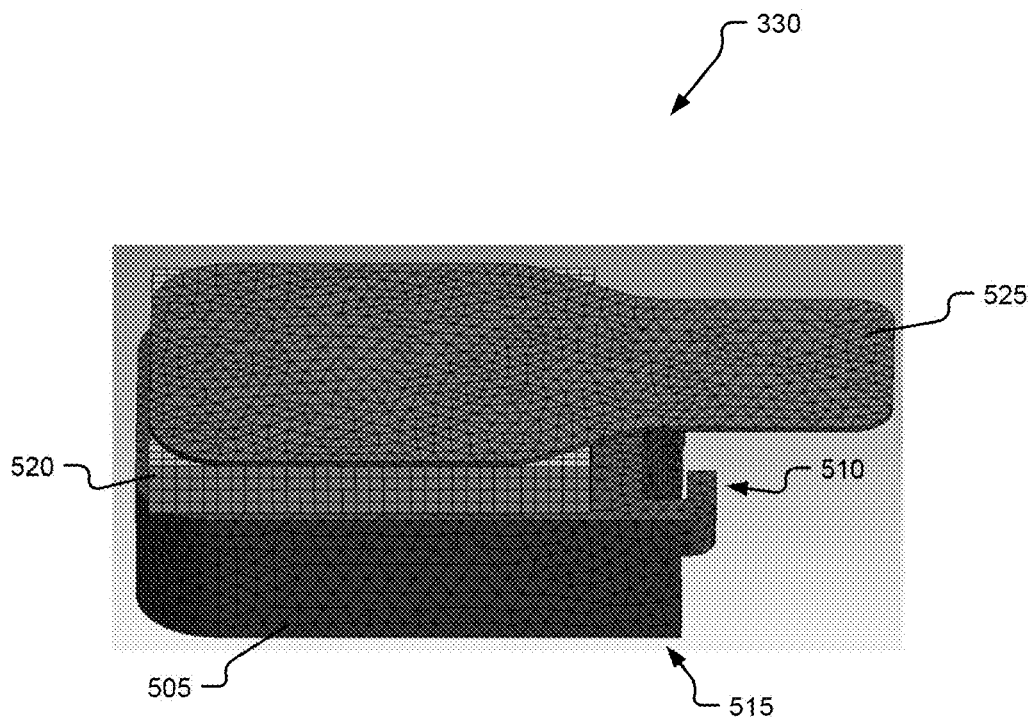
FIG. 5 is a diagram illustrating an exemplary sensor according to one embodiment of the present disclosure.

FIG. 5 is a diagram illustrating an exemplary sensor according to one embodiment of the present disclosure. Generally speaking, a force sensitive device can be placed on top of two materials to reach the gap height in between the plate where the pogo pins are installed and the staging plate of the ICT where the PCB sits. As illustrated in this example, each of the one or more sensors 330 can comprise a rigid base 505 having a top side 510 and a bottom side 515, wherein the top side 510 is opposite the bottom side 515. The rigid base 505 can comprise, for example, a steel, aluminum, or plastic riser that can act as a hard stop for the sensor during in-circuit testing. The bottom side 515 can be mounted on the clamp shell 310 of the ICT device 305. A compressible layer 520 can be disposed along the top side 510 of the rigid base 505. The compressible layer 520 can comprise, for example, Ethylene-Vinyl Acetate (EVA) or micro-cellular high-density foam to act as a compression spring to prevent damage to the ICT and sensors. A force sensitive device 525 can be disposed on a side of the compressible layer 520 opposite the rigid base 505. For example, the force sensitive device 525 can comprise a force sensitive resistor.

Figure 6:
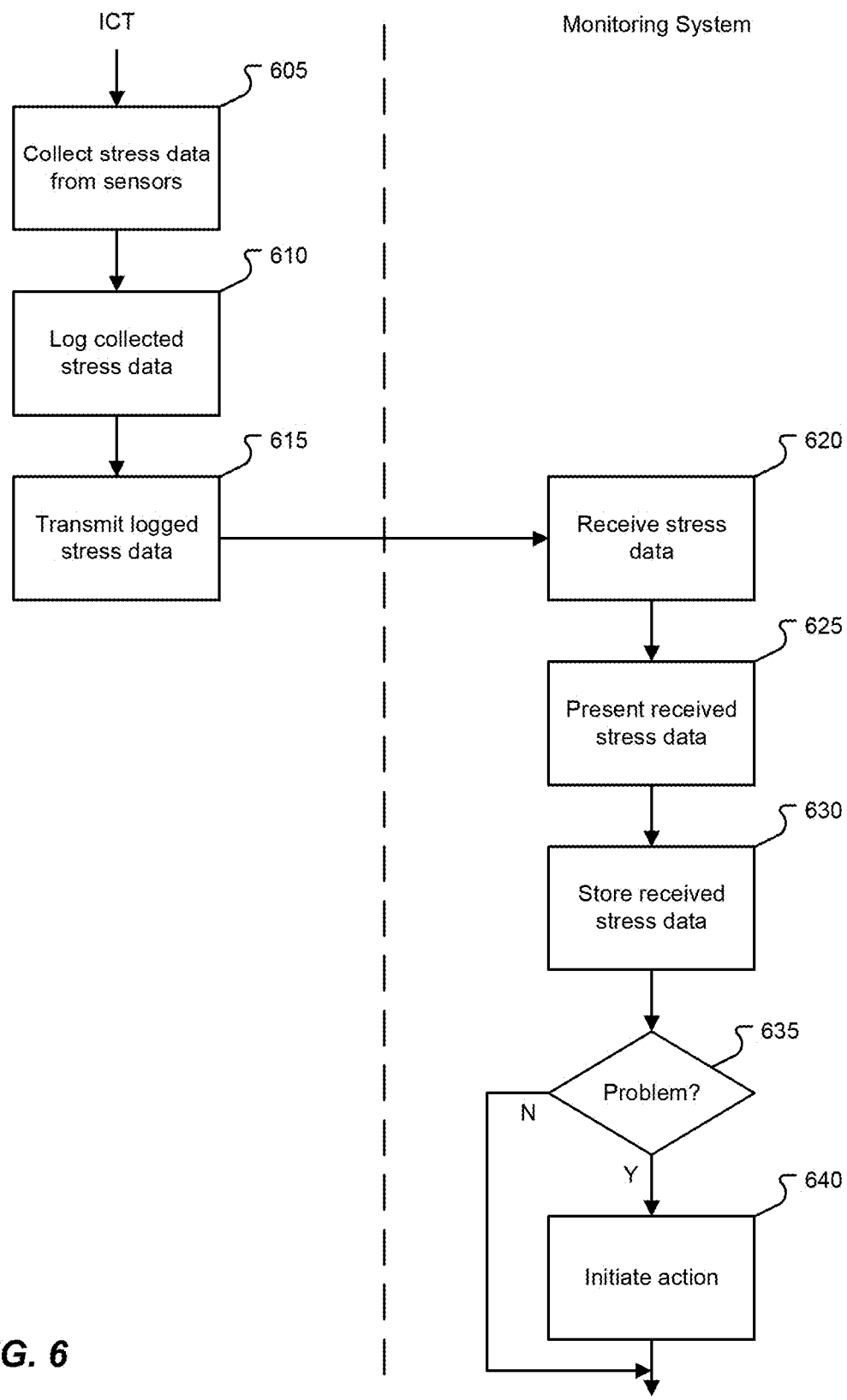
FIG. 6 is a flowchart illustrating an exemplary process for performing in-circuit testing according to one embodiment of the present disclosure.

FIG. 6 is a flowchart illustrating an exemplary process for performing in-circuit testing according to one embodiment of the present disclosure. As illustrated in this example, monitoring a manufacturing and testing process can comprise reading 605, by an IoT device 335, an input signal from each of one or more sensors 330A and 330B. The IoT device 335 and one or more sensors 330A and 330B are disposed within an ICT 305, wherein the input signal from each sensor indicates an amount of force on a PCB 315 mounted in a clamp shell 310 of the ICT 305. The input signal can be read 605 from each of the sensors 330A and 330B in real-time while a test is being conducted on the PCB 315. A set of results indicating the amount of force on the PCB 315 during the test can be logged 610 by the IoT device based on the input signal from each of the one or more sensors 330A and 330B. The logged 610 set of results indicating the amount of stress on the PCB 315 during the test can be transmitted 615 by the IoT device to a monitoring system 340.

The monitoring system 340 can receive 620 the logged data from the IoT device 335 and present 625 a visual indication of the force applied to the PCB 315 during the test based on the received 620 data logged by the IoT device 335. For example, the monitoring system 340 may present 625 a graphical and/or textual user interface 355 etc.

The monitoring system 340 can also store 630 the received 620 data in a set of historical records 345, i.e., sets of results from previous tests sent to the monitoring system 340 by the same and/or other IoT devices. From or based on this set of historical records 345, a determination 635 can be made as to whether the received data logged by the IoT device 335 indicates a problem with the PCB 315, e.g., whether a force detected exceeds a threshold or a force detected is greater or less than previous results by a predetermined maximum variance, etc. In response to determining 635 the received data logged by the IoT device indicates a problem with the PCB, the monitoring system 340 may initiate 640 an action directed to the problem. For example, the monitoring system 340 may present a warning, alarm, or other indication in a user interface 355, issue a message or otherwise signal production and/or other testing system to halt production, etc.

The present disclosure, in various aspects, embodiments, and/or configurations, includes components, methods, processes, systems, and/or apparatus substantially as depicted and described herein, including various aspects, embodiments, configurations embodiments, sub-combinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. An In-Circuit Tester (ICT) device comprising:
a clamp shell;
one or more sensors disposed at one or more locations in the clamp shell; and
an Internet-of-Things (IoT) device coupled with the one or more sensors, the IoT device comprising a processor and a memory coupled with and readable by the processor, the memory storing therein a set of instructions which, when executed by the processor, causes the processor to:
read an input signal from each of the one or more sensors, the input signal from each sensor indicating an amount of force on a Printed Circuit Board (PCB) mounted in the clamp shell, wherein the input signal is read from each of the sensors in real-time while a test is being conducted on the PCB, and
log a set of results indicating the amount of force on the PCB during the test based on the input signal from each of the one or more sensors.

2. The ICT device of claim 1, wherein the instructions further cause the processor to transmit the logged set of results indicating the amount of stress on the PCB during the test to a monitoring system.

3. The ICT device of claim 1, wherein the ICT device further comprises an amplifier coupled with each of the one or more sensors and an analog-to-digital converter coupled with the analog-to-digital converter and the IoT device, and wherein the IoT device reads the input signal from each of the one or more sensors through the amplifier and the analog-to-digital converter.

4. The ICT device of claim 1, wherein the IoT device comprises an Arduino device.

5. The ICT device of claim 1, wherein the IoT device comprises a Raspberry-Pi device.

6. The ICT device of claim 1, wherein each of the one or more sensors comprises:
a rigid base having a top side and a bottom side, the bottom side being mounted on the clamp shell of the ICT device, wherein the top side is opposite the bottom side;
a compressible layer disposed along the top side of the rigid base; and
a force sensitive device disposed on a side of the compressible layer opposite the rigid base.

7. The ICT device of claim 6, wherein the force sensitive device comprises a force sensitive resistors.

8. The ICT device of claim 1, wherein the force indicated by the set of results logged by the IoT device indicate a stress placed on the PCB during the test.

9. A monitoring system of an manufacturing and testing environment, the monitoring system comprising:
a processor; and
a memory coupled with and readable by the processor and storing therein a set of instructions which, when executed by the processor, causes the processor to:
receive, from an Internet-or-Things (IoT) device, data logged by the IoT device, wherein the IoT device is disposed within an In-Circuit Tester (ICT), wherein the data logged by the IoT device is logged in real-time during a test conducted on a Printed Circuit Board (PCB) mounted on the ICT, and wherein the data logged by the IoT device indicates a force applied to the PCB during the test; and
present, in a user interface, a visual indication of the force applied to the PCB during the test based on the received data logged by the IoT device.

10. The monitoring system of claim 9, wherein the instructions further cause the processor to store the received data logged by the IoT device in a set of historical records.

11. The monitoring system of claim 10, wherein the instructions further cause the processor to determine whether the received data logged by the IoT device indicates a problem with the PCB.

12. The monitoring system of claim 11, wherein determining whether the received data logged by the IoT device indicates a problem with the PCB is based on the set of historical records.

13. The monitoring system of claim 11, wherein, in response to determining the received data logged by the IoT device indicates a problem with the PCB, the instructions further cause the processor to initiate an action directed to the problem.

14. A method for monitoring a manufacturing and testing process, the method comprising:
reading, by an Internet-of-Things (IoT) device, an input signal from each of one or more sensors, wherein the IoT device and one or more sensors are disposed within an In-Circuit Tester (ICT), wherein the input signal from each sensor indicates an amount of force on a Printed Circuit Board (PCB) mounted in a clamp shell of the ICT, and wherein the input signal is read from each of the sensors in real-time while a test is being conducted on the PCB;

logging, by the IoT device, a set of results indicating the amount of force on the PCB during the test based on the input signal from each of the one or more sensors; and transmitting, by the IoT device, the logged set of results indicating the amount of stress on the PCB during the test to a monitoring system.

15. The method of claim 14, further comprising:

receiving, by the monitoring system, from the IoT device, the data logged by the IoT device; and presenting, by the monitoring system, in a user interface, a visual indication of the force applied to the PCB during the test based on the received data logged by the IoT device.

16. The method of claim 15, further comprising storing, by the monitoring system, the received data logged by the IoT device in a set of historical records.

17. The method of claim 16, further comprising determining, by the monitoring system, whether the received data logged by the IoT device indicates a problem with the PCB.

18. The method of claim 17, wherein determining whether the received data logged by the IoT device indicates a problem with the PCB is based on the set of historical records.

19. The method of claim 17, further comprising, in response to determining the received data logged by the IoT device indicates a problem with the PCB, initiating, by the monitoring system, an action directed to the problem.

20. The method of claim 14, wherein the IoT device comprises one of an Arduino device or a Raspberry-Pi device.

* * * * *